(12) United States Patent
Brinkman et al.

(10) Patent No.: US 8,611,053 B2
(45) Date of Patent: Dec. 17, 2013

(54) CURRENT-PERPENDICULAR-TO-THE-PLANE (CPP) MAGNETORESISTIVE SENSOR WITH MULTILAYER REFERENCE LAYER INCLUDING A HEUSLER ALLOY

(75) Inventors: Elizabeth Ann Brinkman, Santa Clara, CA (US); Matthew J. Carey, San Jose, CA (US); Jeffrey R. Childress, San Jose, CA (US); Young-suk Choi, Los Gatos, CA (US); Brian R. York, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 93 days.

(21) Appl. No.: 13/415,813

(22) Filed: Mar. 8, 2012

(65) Prior Publication Data

US 2013/0236744 A1    Sep. 12, 2013

(51) Int. Cl.
    *G11B 5/39*    (2006.01)
(52) U.S. Cl.
    USPC .................................................. 360/324.11
(58) Field of Classification Search
    USPC .......... 360/324, 324.1, 324.11, 324.12, 324.2
    See application file for complete search history.

(56) References Cited

U.S. PATENT DOCUMENTS

| | | | |
|---|---|---|---|
| 6,898,112 B2 * | 5/2005 | Janesky et al. | 365/158 |
| 6,998,061 B1 | 2/2006 | Cross | |
| 7,248,497 B2 * | 7/2007 | Saito et al. | 365/158 |
| 7,310,207 B2 * | 12/2007 | Hasegawa et al. | 360/324.11 |
| 7,428,130 B2 * | 9/2008 | Jogo et al. | 360/324.12 |
| 7,558,028 B2 * | 7/2009 | Carey et al. | 360/324.12 |
| 7,580,229 B2 | 8/2009 | Carey et al. | |
| 7,739,787 B2 * | 6/2010 | Shimazawa et al. | 29/603.16 |
| 7,746,603 B2 * | 6/2010 | Gill | 360/324.12 |
| 7,820,455 B2 * | 10/2010 | Gill et al. | 438/3 |
| 7,855,860 B2 | 12/2010 | Ishiwata | |
| 7,973,351 B2 * | 7/2011 | Marukame et al. | 257/295 |
| 7,978,439 B2 | 7/2011 | Zhang et al. | |
| 8,107,202 B2 * | 1/2012 | Lee et al. | 360/324.2 |
| 8,268,641 B2 * | 9/2012 | Guo et al. | 438/3 |
| 8,467,154 B2 * | 6/2013 | Covington et al. | 360/324.1 |
| 2005/0266274 A1 * | 12/2005 | Hasegawa et al. | 428/828 |
| 2008/0112095 A1 * | 5/2008 | Carey et al. | 360/324.12 |
| 2008/0316657 A1 | 12/2008 | Zhang et al. | |

(Continued)

OTHER PUBLICATIONS

Tezuka, et al., "175% tunnel magnetoresistance at room temperature and high thermal stability using Co2FeAl0.5Si0.5 full-Heusler alloy electrodes", Applied Physics Letters 89, 252508 (2006).

Yoo et al., "Effect of Diffusion Barrier in the Thermally Annealed Exchange-Biased IrMn-CoFe Electrode IN Magnetic Tunnel Junctions", IEEE Transactions on Magnetics, vol. 38. No. Sep. 5, 2002.

(Continued)

*Primary Examiner* — Brian Miller
(74) *Attorney, Agent, or Firm* — Thomas R. Berthold

(57) ABSTRACT

A current-perpendicular-to-the-plane giant magnetoresistance (CPP-GMR) sensor has a multilayer reference layer containing a Heusler alloy. The multilayer reference layer may be a simple pinned layer or the AP2 layer of an antiparallel (AP)-pinned structure. The multilayer reference layer is formed of a crystalline non-Heusler alloy ferromagnetic layer on either an antiferromagnetic layer (in a simple pinned structure) or an antiparallel coupling (APC) layer (in an AP-pinned structure), a Heusler alloy layer adjacent the sensor's nonmagnetic electrically conducting spacer layer, and an intermediate substantially non-crystalline X-containing layer between the crystalline non-Heusler alloy layer and the Heusler alloy layer. The element X is selected from one or more of tantalum (Ta), hafnium (Hf), niobium (Nb) and boron (B).

18 Claims, 7 Drawing Sheets

(56) References Cited

U.S. PATENT DOCUMENTS

| | | | | |
|---|---|---|---|---|
| 2009/0284873 | A1* | 11/2009 | Gill | 360/314 |
| 2011/0134563 | A1 | 6/2011 | Komagaki et al. | |
| 2011/0200845 | A1* | 8/2011 | He et al. | 428/811.2 |
| 2012/0112299 | A1* | 5/2012 | Inomata et al. | 257/421 |
| 2012/0295131 | A1* | 11/2012 | He et al. | 428/811.3 |
| 2013/0064971 | A1* | 3/2013 | Carey et al. | 427/123 |

OTHER PUBLICATIONS

Kim et al., "Enhanced Exchange Bias and Thermal Stability of Magnetic Tunnel Junctions with Ta Blocking Layer", J. Kor. Phys. Soc. 45(3) Sep. 2004 pp. 683-686.

Xu et al., "Synthetic antiferromagnet with Heusler alloy Co2FeAl ferromagnetic layers", J. Appl. Phys. 106, 123902 (2009).

\* cited by examiner

CURRENT-PERPENDICULAR-TO-THE-PLANE (CPP) MAGNETORESISTIVE SENSOR WITH MULTILAYER REFERENCE LAYER INCLUDING A HEUSLER ALLOY

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to a CPP sensor with an improved ferromagnetic reference layer.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically formed of Cu or Ag. One ferromagnetic layer, typically called the "reference" layer, has its magnetization direction fixed, such as by being pinned by exchange coupling with an adjacent antiferromagnetic layer, and the other ferromagnetic layer, typically called the "free" layer, has its magnetization direction free to rotate in the presence of an external magnetic field. With a sense current applied to the sensor, the rotation of the free-layer magnetization relative to the fixed-layer magnetization is detectable as a change in electrical resistance. If the sense current is directed perpendicularly through the planes of the layers in the sensor stack, the sensor is referred to as current-perpendicular-to-the-plane (CPP) sensor.

In a magnetic recording disk drive CPP-GMR read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance.

The reference ferromagnetic layer in a CPP-GMR sensor used in read heads may be a single pinned layer (sometimes called a simple pinned layer) or part of an antiparallel (AP) pinned structure. The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's electrically conductive spacer layer on the other side, is the reference layer. The AP1 layer, which is typically in contact with an antiferromagnetic layer, such as IrMn, on one side and the nonmagnetic APC layer on the other side, is typically referred to as the pinned layer. The AP-pinned structure minimizes magnetostatic coupling between the reference layer and the CPP-SV free ferromagnetic layer. The AP-pinned structure, also called a "laminated" pinned layer, and sometimes called a synthetic antiferromagnet (SAF), is described in U.S. Pat. No. 5,465,185.

The materials making up the free layer and the reference layer (either the simple pinned layer or the AP2 layer in an AP-pinned structure) are typically crystalline alloys of CoFe or NiFe. However, Heusler alloys, which are chemically ordered alloys like $Co_2MnX$ (where X is one or more of Ge, Si, Sn, Ga or Al) and $Co_2FeZ$ (where Z is one or more of Ge, Si, Al, Sn or Ga), are known to have high spin-polarization and result in an enhanced magnetoresistance and are thus desirable ferromagnetic materials to use in one or both of the reference layer and free layer. In the reference layer, Heusler alloys are usually deposited directly on a layer of a crystalline ferromagnetic material such as Co or CoFe. Heusler alloys require significant post-deposition annealing to achieve chemical ordering and high spin-polarization.

What is needed is a CPP-GMR sensor with a Heusler alloy reference layer with improved magnetoresistance.

SUMMARY OF THE INVENTION

The invention relates to a CPP-GMR sensor with a multilayer reference layer containing a Heusler alloy that results in improved magnetoresistance. The multilayer reference layer, which may be a simple pinned layer or the AP2 layer of an AP-pinned structure, is a multilayer that includes a Heusler alloy. The multilayer reference layer is a crystalline non-Heusler alloy ferromagnetic layer on either an antiferromagnetic layer (in a simple pinned structure) or an APC layer (in an AP-pinned structure), a Heusler alloy layer adjacent the nonmagnetic electrically conducting spacer layer, and an intermediate substantially non-crystalline X-containing layer between the crystalline non-Heusler alloy layer and the Heusler alloy layer. The element X is tantalum (Ta), niobium (Nb), hafnium (Hf) or boron (B) but preferably Ta, or a X-containing layer or multilayer formed from alloys of CoX, FeX, CoFeX and CoFeZrX, where X is one or more of the above-listed elements. As deposited on the X-containing layers the Heusler alloy layers are more disordered, nearly nanocrystalline, than when grown on crystalline non-Heusler alloy layers. Upon annealing the Heusler alloy layers not only crystallize, but also show a higher degree of chemical ordering than layers grown without the X-containing layers beneath the Heusler alloy layers.

For a fuller understanding of the nature and advantages of the present invention, reference should be made to the following detailed description taken together with the accompanying figures.

DETAILED DESCRIPTION OF THE INVENTION

Figure 1:
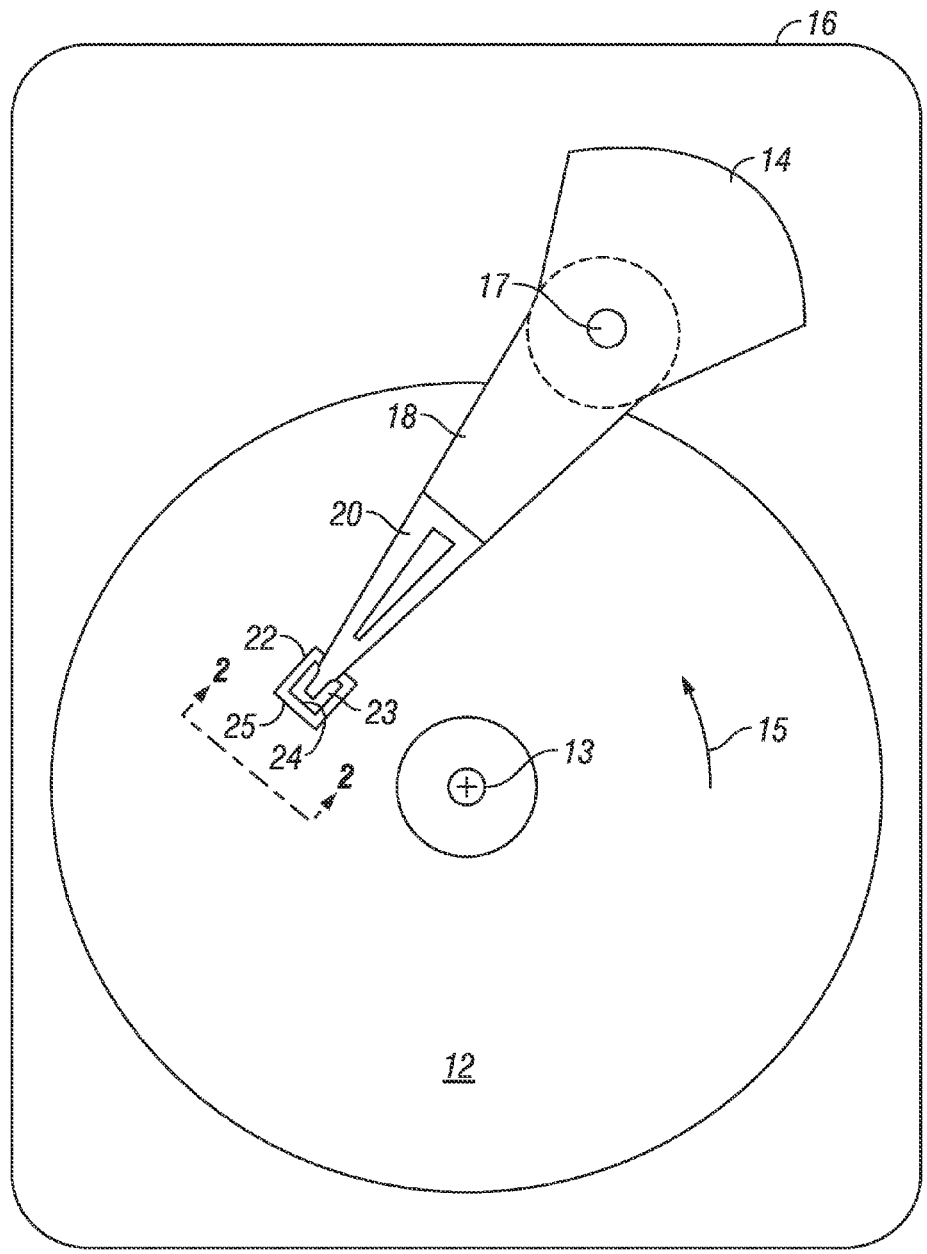
FIG. 1 is a schematic top view of a conventional magnetic recording hard disk drive with the cover removed.

The CPP magnetoresistive (MR) sensor made according to this invention has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
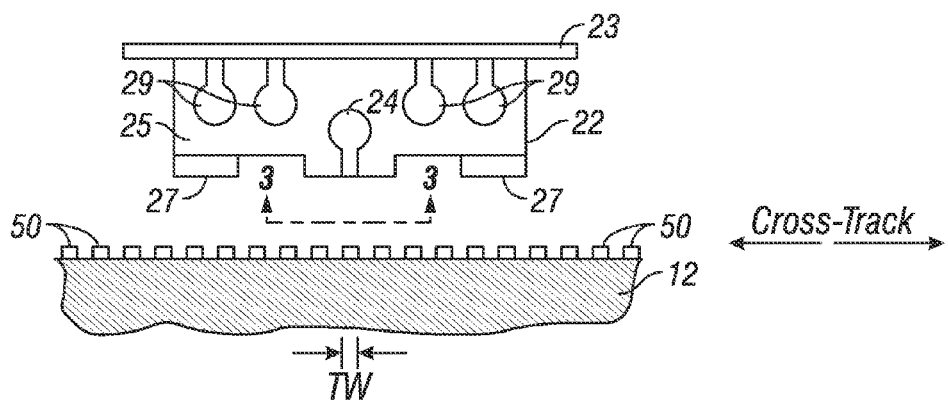
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
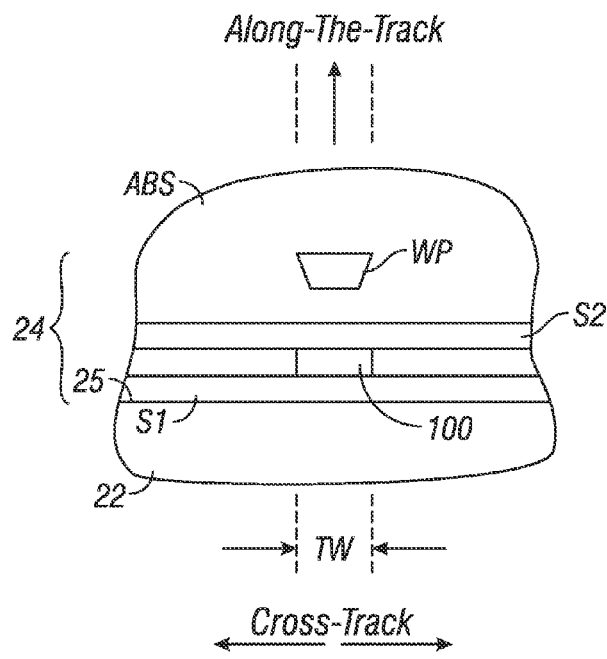
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material and are electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
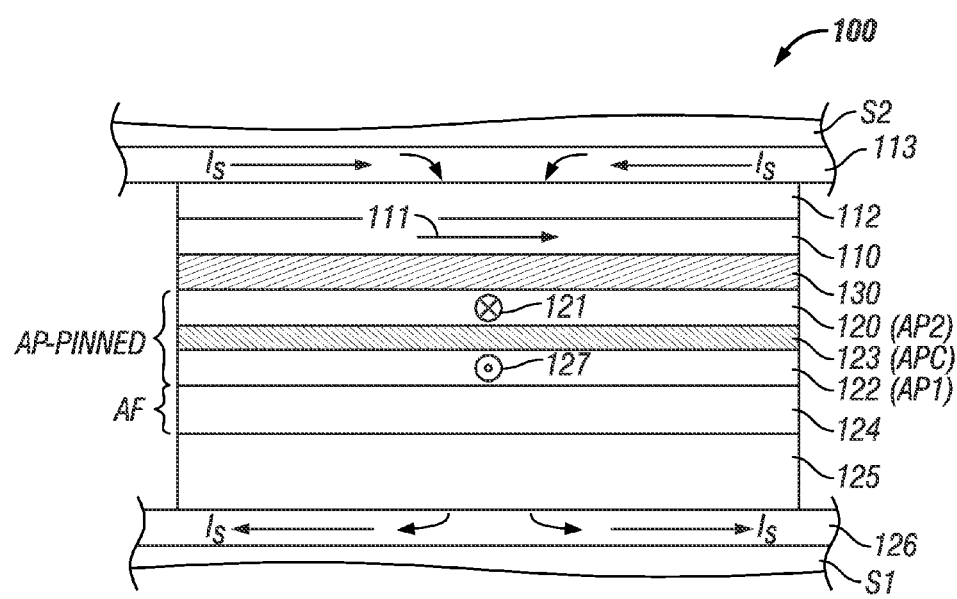
FIG. 4 is a cross-sectional schematic view of a prior art CPP-GMR read head having an antiparallel-pinned (AP-pinned) structure and showing the stack of layers located between the magnetic shield layers.

FIG. 4 is an enlarged sectional view showing the layers making up sensor 100 as would be viewed from the disk. Sensor 100 is a CPP-GMR read head comprising a stack of layers formed between the two magnetic shield layers S1, S2 that are typically electroplated NiFe alloy films. The shields S1, S2 are formed of electrically conductive material and thus may also function as electrical leads for the sense current $I_S$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include an anti-parallel (AP) pinned (AP-pinned) structure, a free ferromagnetic layer 110, and an electrically conductive nonmagnetic spacer layer 130, typically a metal or metal alloy like Cu, Au, Ag or their alloys, between the AP-pinned structure and the free layer 110. A capping layer 112 is located between free layer 110 and the upper shield layer S2. The capping layer 112 provides corrosion protection during processing and magnetically separates the free layer from S2 and may be a single layer or multiple layers of different conductive materials, such as Ru, Ta, NiFe or Cu.

The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer 120, which is in contact with the nonmagnetic APC layer 123 on one side and the sensor's electrically nonmagnetic spacer layer 130 on the other side, is typically referred to as the reference layer 120. The AP1 layer 122, which is typically in contact with an antiferromagnetic layer 124 on one side and the nonmagnetic APC layer 123 on the other side, is typically referred to as the pinned layer. The AP-pinned structure minimizes the net magnetostatic coupling between the reference/pinned layers and the CPP MR free ferromagnetic layer. The AP-pinned structure, also called a "laminated" pinned layer, and sometimes called a synthetic antiferromagnet (SAF), is described in U.S. Pat. No. 5,465,185.

The APC layer 123 is typically Ru, Ir, Rh, Cr, Os or alloys thereof. The AP1 and AP2 layers are typically formed of crystalline CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 is the pinned layer that has a fixed magnetization direction that is pinned by being exchange-coupled to an antiferromagnetic (AF) layer 124 as shown in FIG. 4. The AF layer 124 is typically one of the antiferromagnetic Mn alloys, e.g., PtMn, NiMn, FeMn, IrMn, PdMn, PtPdMn or RhMn, which are known to provide relatively high exchange-bias fields. Typically the Mn alloy material provides lower or little exchange-biasing in the as-deposited state, but when annealed provides stronger exchange-biasing of the pinned ferromagnetic layer 122. A seed layer 125 may be located between the lower shield layer S1 and the antiferromagnetic layer 124 and enhances the growth of the antiferromagnetic layer 124. The seed layer 125 is typically one or more layers of NiFeCr, NiFe, CoFe, CoFeB, CoHf, Ta, Cu or Ru.

The CPP GMR sensor is depicted in FIG. 4 with an AP-pinned structure with AP1 as the pinned layer 122. Alternatively, the CPP GMR sensor may have a single or simple pinned layer. In a simple pinned layer, there is no APC layer 123 and no AP2 layer 120, but only the ferromagnetic layer 122 which is the reference layer. The reference layer 122 would be located between and in contact with the antiferromagnetic layer 124 and the electrically conductive spacer layer 130.

The typical materials used for reference layer 122 are crystalline CoFe or NiFe alloys, or a multilayer of these materials, such as a CoFe/NiFe bilayer. Heusler alloys, i.e., metallic compounds having a Heusler alloy crystal structure like $Co_2MnX$, for example, have been proposed for use as ferromagnetic layers in reference layers for CPP-GMR sensors. In the case of an AP-pinned structure, the Heusler alloy reference layer is usually separated from the APC layer by a crystalline ferromagnetic material such as Co or CoFe to improve the magnetic coupling between the AP1 and AP2 layers through the APC layer. Similarly, in a simple pinned layer, the Heusler alloy reference layer is separated from the IrMn antiferromagnetic layer by a layer of crystalline CoFe or Co to improve the coupling of the Heusler alloy layer to the IrMn layer.

In the CPP-GMR sensor of this invention, the reference layer, which may be a simple pinned layer or the AP2 layer of an AP-pinned structure, is a multilayer that includes a Heusler alloy. However, it has been discovered, as part of the development of this invention, that the magnetoresistance (ΔR/R) of a CPP-GMR sensor can be significantly enhanced if an amorphous or nanocrystalline X-containing layer is inserted between the Heusler layer and the crystalline layer. The element X is tantalum (Ta), niobium (Nb), hafnium (Hf) or boron (B) but preferably Ta, or a X-containing layer or multilayer formed from alloys of CoX, FeX, CoFeX and CoFeZrX, where X is one or more of the above-listed elements.

Figure 5:
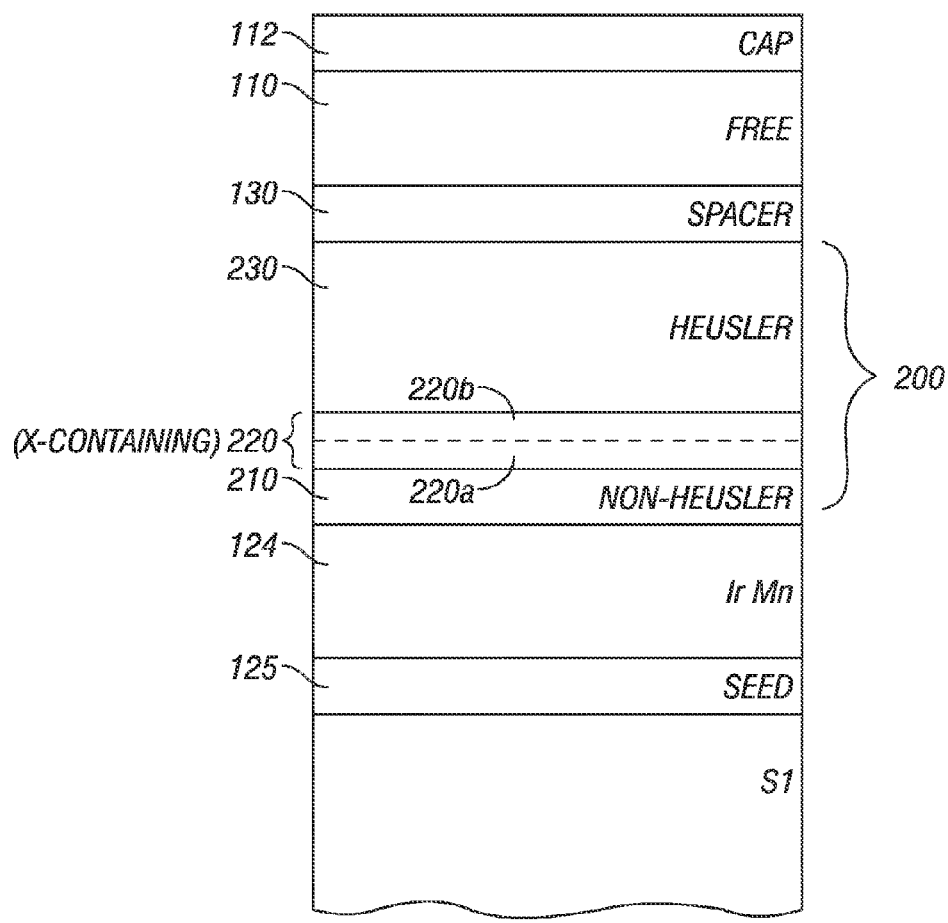
FIG. 5 is a cross-sectional schematic view of the multilayer reference layer structure of the present invention.

FIG. 5 is a sectional view showing the multilayer reference layer according to the invention in a simple pinned configuration. The substrate is shield layer S1. A seed layer 125, for example a bilayer of Ru on Ta, is deposited on S1. The antiferromagnetic layer 124 is any conducting antiferromagnetic layer, but is preferably an alloy consisting essentially of IrMn, for example a $Ir_{80}Mn_{20}$ alloy, where the subscripts represent atomic percent. The antiferromagnetic layer 124 has a typical thickness in the range of about 40 to 70 Å. The reference layer 200 is a multilayer reference layer of a crystalline non-Heusler alloy ferromagnetic layer 210 on and in contact with the IrMn antiferromagnetic layer 124, a Heusler alloy layer 230 adjacent the nonmagnetic electrically conducting spacer layer 130, and an intermediate substantially non-crystalline X-containing layer 220 between the non-Heusler alloy layer 210 and the Heusler alloy layer 230, where X is selected from one or more of tantalum (Ta), hafnium (Hf), niobium (Nb) and boron (B). The non-crystalline X-containing layer 220 may be either a single layer or a bilayer of an amorphous ferromagnetic first layer 220a selected from alloys of CoX, FeX, CoFeX and CoFeZrX, where X is one or more of Ta, Hf, Nb and B, on and in contact with the non-Heusler alloy layer and a second layer 220b consisting essentially of one of Ta, Hf, Nb and B on and in contact with said first layer.

The crystalline non-Heusler alloy layer 210 may be formed of a ferromagnetic alloy comprising a layer or multilayer of one or more of Co, Fe and Ni, but is preferably a single layer of a CoFe alloy, like $Co_2Fe$, with a thickness in the range of about 4 to 20 Å. The non-Heusler alloy layer 210 may alternatively be a multilayer, such as a bilayer of Co and CoFe. The Heusler alloy layer 230 is formed of a material selected from $Co_2MnX$ (where X is one or more of Ge, Si, Sn, Ga or Al) and $Co_2FeZ$ (where Z is one or more of Ge, Si, Al, Sn or Ga) with a typical thickness in the range of about 10 to 60 Å.

The preferred material for the X-containing layer 220 is Ta and the preferred structure is a bilayer of a first CoFeBTa layer with a typical thickness in the range of about 2 to 10 Å on the non-Heusler alloy layer 210 and second Ta layer with a typical thickness in the range of about 0.5 to 2 Å on the first CoFeBTa layer. The CoFeBTa layer may have a composition of approximately $Co_{75}Fe_{25}$ with about 12 to 30 atomic percent B and about 5 to 15 atomic percent Ta. The Ta-containing layer 220 may alternatively be a single layer consisting essentially of Ta with a typical thickness in the range of about 0.5 to 3 Å or a single layer of CoFeBTa with a typical thickness in the range of about 2 to 10 Å. While Ta is the preferred material to be included in the X-containing layer 220, other materials may function as well. These include hafnium (Hf), niobium (Nb) and boron (B). Thus, for example, the layer 220 may be single layers of Ta, Hf, Nb or B, or single layers or multilayers formed from alloys of CoX, FeX, CoFeX and CoFeZrX, where X is one or more of Ta, Hf, Nb and B.

The X-containing layer is substantially non-crystalline, meaning that it may be amorphous or nanocrystalline, i.e., localized small crystallites but no significant long range ordering. It is believed that the substantially non-crystalline structure of the X-containing layer 220 enhances the crystalline structure of the Heusler alloy layer 230 during subsequent annealing. The X-containing layer should not be in contact with the antiferromagnetic layer 124 because the X material would reduce the exchange coupling with the antiferromagnetic layer 124. Thus it is important that the non-Heusler alloy layer 210, which separates the X-containing layer 220 from the antiferromagnetic layer 124, not contain any X material.

In the fabrication of the CPP-GMR sensor with the multilayer reference layer shown in FIG. 5, the layers, including the antiferromagnetic layer 124 and the Heusler alloy layer 230, both of which must be annealed, up through and including the capping layer 112, are deposited sequentially on S1. The material that will make up the Heusler alloy layer 230 is sputter deposited on the X-containing layer 220. For example, if the Heusler alloy is to be chemically-ordered $Co_2MnSi$, then a single target or multiple targets with Co, Mn and Si are used to sputter deposit a disordered layer containing the proper relative amounts of these elements. A high-temperature anneal is then performed in the vacuum chamber at about 300-500° C. for about 5-30 minutes. This results in the microstructural improvement of both the antiferromagnetic layer 124 and the Heusler alloy layer 230. The structure is removed from the vacuum chamber. An optional low-temperature anneal can then be performed at 200-250° C. for about 1-5 hours. The purpose of the optional low-temperature anneal is to further anneal the antiferromagnetic layer 124 to improve the exchange biasing with the non-Heusler alloy layer 210.

Figure 6:
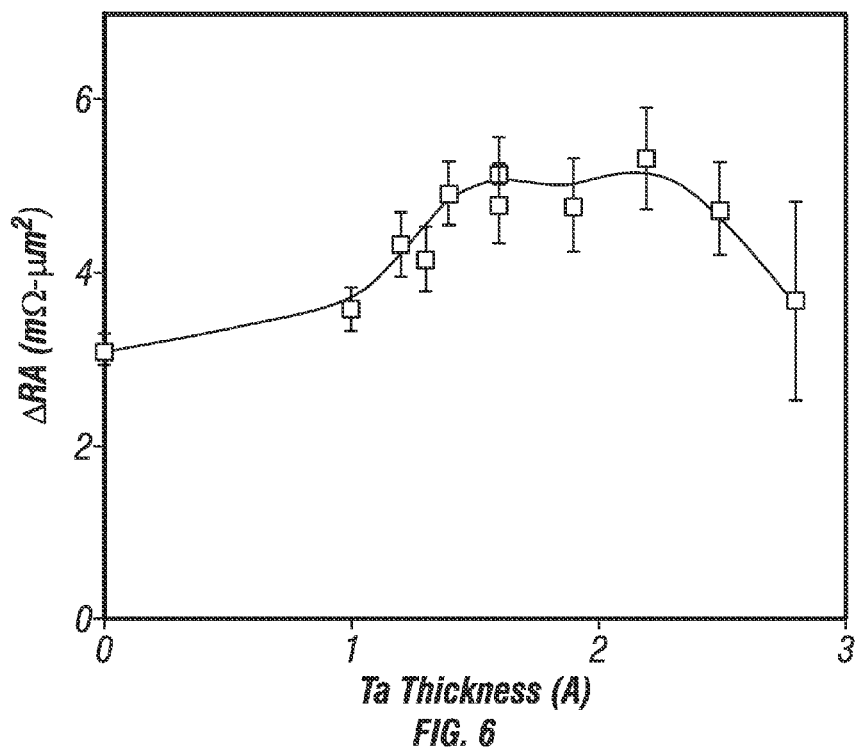
FIG. 6 is a graph of $\Delta RA$ (resistance-area product) as a function tantalum (Ta) thickness for a CPP-GMR structure with a multilayer reference layer having a Ta layer according to the invention.

FIG. 6 is a graph of ΔRA (resistance-area product) as a function Ta thickness (t) for a CPP-GMR structure with a simple pinned multilayer reference layer having a Ta layer 220 according to the invention. The samples tested were of the form:

60 Å IrMn antiferromagnetic layer/4 Å Co plus 5 Å $Co_{50}Fe_{50}$ non-Heusler bilayer/t Ta/32 Å $Co_2MnGe$ Heusler alloy layer/ 36 Å Ag spacer layer/antiparallel-free layer of lower 50 Å

Co$_2$MnGe Heusler alloy plus 10 Å Co$_{50}$Fe$_{50}$ with 8 Å Ru APC layer and 15 Å CoFe upper layer The graph of FIG. 6 shows an increase in ΔRA from about 3.5 mΩ-μm$^2$ for no Ta to about 5 mΩ-μm$^2$ for a Ta thickness from about 1.5 Å to about 2.5 Å.

Figure 7:
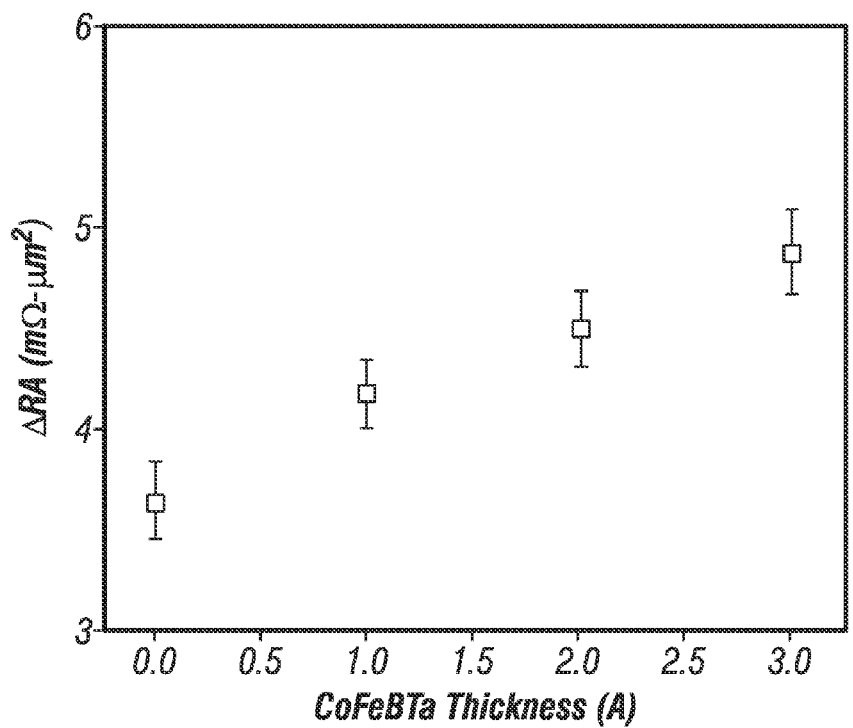
FIG. 7 is a graph of $\Delta RA$ (resistance-area product) as a function CoFeBTa thickness for a CPP-GMR structure with a multilayer reference layer having a CoFeBTa layer according to the invention.

FIG. 7 is a graph of ΔRA (resistance-area product) as a function CoFeBTa thickness (t) for a CPP-GMR structure with a simple pinned multilayer reference layer having a CoFeBTa layer 220 according to the invention. The samples tested were identical to those for FIG. 6 except the X-containing layer was CoFeBTa. The graph of FIG. 7 shows an increase in ΔRA from about 3.6 mΩ-μm$^2$ for no CoFeBTa to between about 4.1 to 4.9 mΩ-μm$^2$ for CoFeBTa thicknesses from about 1 Å to about 3 Å.

Figure 8:
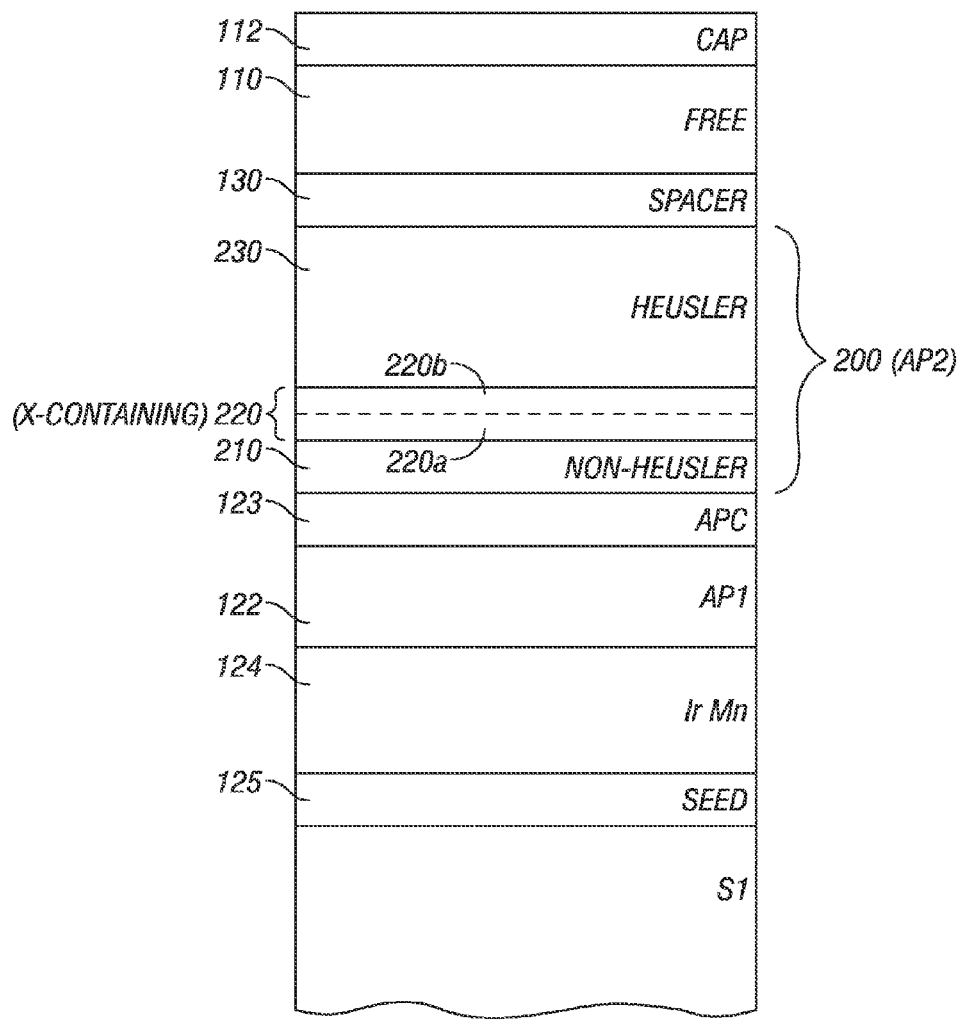
FIG. 8 is a cross-sectional schematic view of the multilayer reference layer according to the invention in an antiparallel (AP) pinned structure.

FIG. 8 is a sectional view showing the multilayer reference layer according to the invention in an AP-pinned structure. The substrate is shield layer S1. A seed layer 125, for example a bilayer of Ru on Ta, is deposited on S1. The antiferromagnetic layer 124 is any conducting antiferromagnetic layer, but is preferably an alloy consisting essentially of IrMn, for example a Ir$_{80}$Mn$_{20}$ alloy, where the subscripts represent atomic percent. The antiferromagnetic layer 124 pins the magnetization direction of the AP1 ferromagnetic layer. The reference layer 200 is a multilayer reference layer of a non-Heusler alloy ferromagnetic layer 210 on and in contact with the APC layer 123, a Heusler alloy layer 230 adjacent the nonmagnetic electrically conducting spacer layer 130, and an intermediate substantially non-crystalline X-containing layer 220 between the non-Heusler alloy layer 210 and the Heusler alloy layer 230. The Heusler alloy layer 230 has its magnetization direction oriented antiparallel to the magnetization direction of the AP1 layer. The non-crystalline X-containing layer 220 may be either a single layer or a bilayer of an amorphous ferromagnetic first layer 220a selected from alloys of CoX, FeX, CoFeX and CoFeZrX, where X is one or more of Ta, Hf, Nb and B, on and in contact with the non-Heusler alloy layer and a second layer 220b consisting essentially of one of Ta, Hf, Nb and B on and in contact with said first layer.

Figure 9:
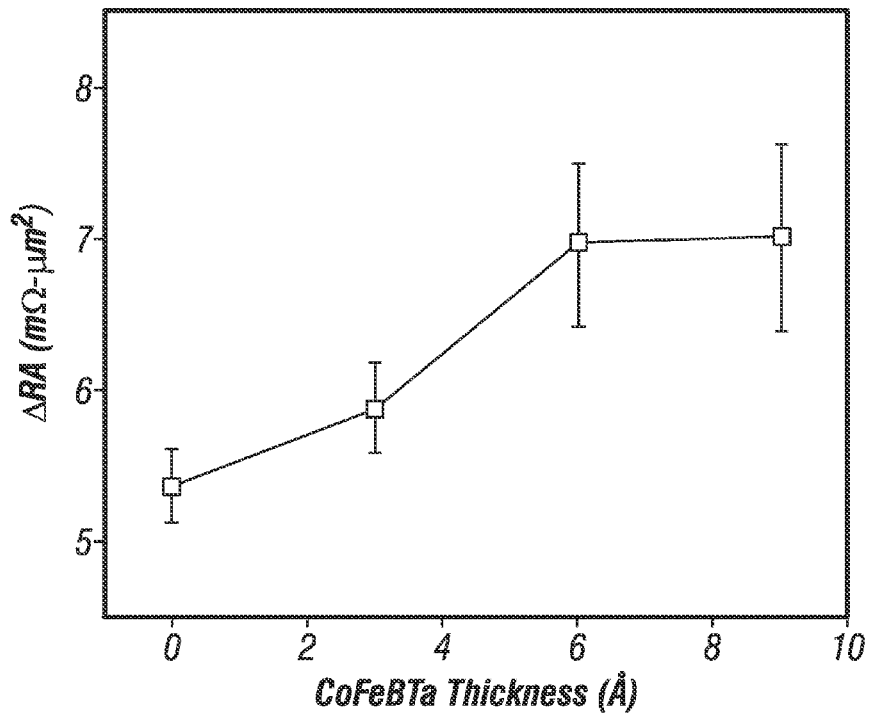
FIG. 9 is a graph of $\Delta RA$ (resistance-area product) as a function CoFeBTa thickness (t) for a CPP-GMR structure with an AP-pinned structure with a multilayer reference layer having a CoFeBTa layer according to the invention.

FIG. 9 is a graph of ΔRA (resistance-area product) as a function CoFeBTa thickness (t) for a CPP-GMR structure with an AP-pinned structure with a multilayer reference layer having a CoFeBTa layer 220 according to the invention. The samples tested were of the form:
55 Å IrMn antiferromagnetic layer/AP1 layer of 4 Å Co plus 24 Å Co$_{50}$Fe$_{50}$ plus t1 Co$_{50}$Fe$_{50}$/8 Å Ru APC layer/7 Å CoFe50 non-Heusler alloy layer/t2 CoFeBTa/38 Å Co$_2$MnGe Heusler alloy layer/40 Å Ag alloy spacer layer/45 Å Co$_2$MnGe Heusler alloy free layer The thickness t1=t2 to keep the magnetic moments of AP1 and AP2 approximately equal and t1, t2 were varied from 0 to 9 Å.

The graph of FIG. 9 shows an increase in ΔRA from about 5.4 mΩ-μm$^2$ for no CoFeBTa to about 7.0 mΩ-μm$^2$ for a CoFeBTa thickness from about 6 Å to about 9 Å.

To determine if the amorphous or nanocrystalline X-containing layer beneath the Heusler alloy adversely affects the crystalline formation of the Heusler alloy, x-ray diffraction scans were taken from samples with Ta layers from 0 to 2.0 Å thick between a CoFe non-Heusler alloy layer and a Co$_2$MnGe Heusler alloy layer before and after annealing. A peak intensity at about 64.5° represents the (200) peak of the Co$_2$MnGe Heusler alloy. For samples before annealing, the thicker the Ta layer, the lower the intensity of the (200) peak. By 2 Å of Ta, the (200) peak is not observed, indicating a substantially non-crystalline structure to the Co$_2$MnGe layer before annealing. However, after annealing the (200) peaks are essentially identical for all Ta thicknesses. This indicates the same level of crystalline perfection for the Co$_2$MnGe in the samples with no Ta film and with Ta films beneath the Co$_2$MnGe.

Figure 10:
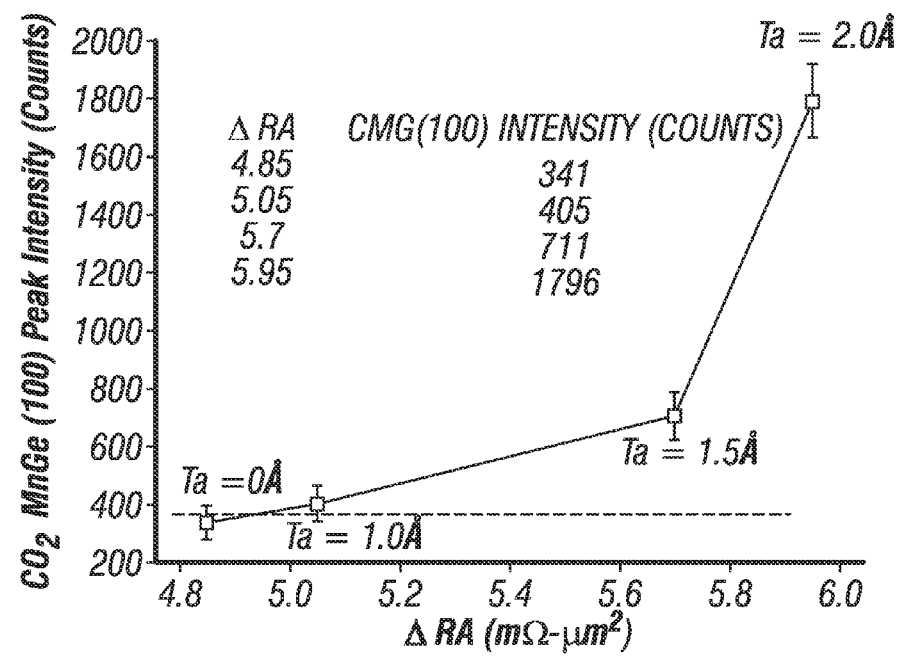
FIG. 10 is a graph of X-ray diffraction scan peak intensity for the (100) peak for the $Co_2MnGe$ Heusler alloy layer as a function of ΔRA for samples with various Ta thicknesses.

FIG. 10 is a graph of X-ray diffraction scan peak intensity for the (100) peak for the Co$_2$MnGe Heusler alloy layer as a function of ΔRA for samples with various Ta thicknesses. The (100) peak only appears when there is chemical ordering, either B2 or L12 structure, in the Heusler alloy. The peak intensity rises from a baseline of about 400 counts/second with no Ta to over 1800 counts per second with 2.0 Å of Ta beneath the Heusler alloy layer. This demonstrates the greater chemical order of the samples grown with the Ta layer. This correlates with an increase in ΔRA from about 4.85 to about 5.95 mΩ-μm$^2$.

Thus the reason for the improved magnetoresistance (ΔR/R) appears to be due to an improvement in the crystalline quality and chemical ordering of the Heusler alloy layer after annealing for layers deposited upon the amorphous or nanocrystalline X-containing layer. As deposited the Heusler alloy layers are more disordered, nearly nanocrystalline, when grown upon the X-containing layers. Upon anneal they not only crystallize, but also show a higher degree of chemical ordering than layers grown without the X-containing layers beneath the Heusler alloy layers.

There has been speculation that the increase in magnetoresistance (ΔR/R) with the multilayer reference layer according to the invention is due to the blocking of diffusion of the Mn from the Heusler alloy layer during annealing. However, Glow Discharge Spectrospy (GDS) was performed on film stacks with and without a Ta layer between a CoFe non-Heusler alloy layer and a Co$_2$MnGe Heusler alloy layer for annealed film stacks. The same profiles were observed with and without a 2 Å Ta layer. This indicates that Mn diffusion is not changed substantially with the presence of the Ta layer and thus the blocking of Mn diffusion is not the reason for the increased magnetoresistance.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor capable of sensing external magnetic fields when a sense current is applied perpendicular to the planes of the layers in the sensor, the sensor comprising:
   a substrate;
   an antiferromagnetic layer comprising Mn on the substrate;
   a multilayer reference layer comprising a non-Heusler alloy ferromagnetic layer on and antiferromagnetically exchange coupled to the antiferromagnetic layer and having a fixed in-plane magnetization direction, a Heusler alloy layer having a fixed in-plane magnetization direction parallel to the magnetization direction of the non-Heusler alloy layer, and a substantially non-crystalline X-containing layer between the non-Heusler alloy layer and the Heusler alloy layer wherein X is selected from one or more of Ta, Hf, Nb and B;
   an electrically conductive spacer layer on and in contact with the Heusler alloy layer; and
   a free layer on the spacer layer and having an in-plane magnetization direction substantially free to rotate in the presence of an external magnetic field.

2. The sensor of claim 1 wherein the antiferromagnetic layer comprises an IrMn alloy.

3. The sensor of claim 1 wherein the non-crystalline X-containing layer consists essentially of Ta.

4. The sensor of claim 1 wherein the non-crystalline X-containing layer comprises a ferromagnetic alloy selected from alloys of CoX, FeX, CoFeX, and CoFeZrX.

5. The sensor of claim 1 wherein the non-crystalline X-containing layer comprises a bilayer of an amorphous ferromagnetic first layer selected from alloys of CoX, FeX, CoFeX and CoFeZrX, where X is one or more of Ta, Hf, Nb and B, on and in contact with the non-Heusler alloy layer and a second layer consisting essentially of one of Ta, Hf, Nb and B on and in contact with said first layer.

6. The sensor of claim 1 wherein the non-Heusler alloy layer comprises a layer of an alloy consisting essentially of Co and Fe.

7. The sensor of claim 1 wherein the layer of Heusler alloy is formed of a material selected from $Co_2MnX$ (where X is one or more of Ge, Si, Sn, Ga or Al) and $Co_2FeZ$ (where Z is one or more of Ge, Si, Al, Sn or Ga).

8. The sensor of claim 1 wherein the sensor is a magnetoresistive read head for reading magnetically recorded data from tracks on a magnetic recording medium, and wherein the substrate is a first shield formed of magnetically permeable material.

9. A current-perpendicular-to-the-plane (CPP) magnetoresistive read head comprising:
a substrate;
an antiferromagnetic layer comprising Mn on the substrate;
a multilayer reference layer on the antiferromagnetic layer, the multilayer reference layer comprising a non-Heusler alloy ferromagnetic layer in contact with the antiferromagnetic layer, a substantially non-crystalline X-containing layer on and in contact with the non-Heusler alloy layer wherein X is selected from one or more of Ta, Hf, Nb, and B and a Heusler alloy layer on and in contact with the X-containing layer and having an in-plane magnetization direction fixed by being pinned to the antiferromagnetic layer, wherein the non-crystalline X-containing layer comprises a bilayer of an amorphous ferromagnetic first layer selected from alloys of CoX, FeX, CoFeX and CoFeZrX, where X is one or more of Ta, Hf, Nb and B, on and in contact with the non-Heusler alloy layer and a second layer consisting essentially of one of Ta, Hf, Nb and B on and in contact with said first layer;
an electrically conductive spacer layer on the Heusler alloy layer of the multilayer reference layer; and
a free layer on the spacer layer and having an in-plane magnetization direction substantially free to rotate in the presence of an external magnetic field.

10. The head of claim 9 wherein said first layer is a CoFeBTa alloy and said second layer consists essentially of Ta.

11. The head of claim 9 wherein the non-Heusler alloy layer comprises a layer of an alloy consisting essentially of Co and Fe.

12. The head of claim 9 wherein the layer of Heusler alloy is formed of a material selected from $Co_2MnX$ (where X is one or more of Ge, Si, Sn, Ga or Al) and $Co_2FeZ$ (where Z is one or more of Ge, Si, Al, Sn or Ga).

13. A current-perpendicular-to-the-plane (CPP) magnetoresistive read head comprising:
a substrate;
an antiferromagnetic layer on the substrate;
an antiparallel (AP) pinned structure on the antiferromagnetic layer comprising a first AP-pinned (AP1) ferromagnetic layer on the antiferromagnetic layer and having an in-plane magnetization direction pinned by the antiferromagnetic layer, an AP coupling (APC) layer on the AP1 layer, and a second AP-pinned (AP2) ferromagnetic reference layer on the APC layer and having an in-plane magnetization direction substantially antiparallel to the magnetization direction of the AP1 layer;
wherein the AP2 layer is a multilayer reference layer comprising a non-Heusler alloy ferromagnetic layer in contact with the APC layer, a substantially non-crystalline X-containing layer on and in contact with the non-Heusler alloy layer wherein X is selected from one or more of Ta, Hf, Nb and B, and a Heusler alloy layer on and in contact with the X-containing layer;
an electrically conductive spacer layer on the Heusler alloy layer of the multilayer reference layer; and
a free layer on the spacer layer and having an in-plane magnetization direction substantially free to rotate in the presence of an external magnetic field.

14. The head of claim 13 wherein the non-crystalline X-containing layer consists essentially of Ta.

15. The head of claim 13 wherein the non-crystalline X-containing layer comprises a ferromagnetic alloy selected from alloys of CoX, FeX, CoFeX and CoFeZrX, where X is one or more of Ta, Hf, Nb and B.

16. The head of claim 13 wherein the non-crystalline X-containing layer comprises a bilayer of an amorphous ferromagnetic first layer selected from alloys of CoX, FeX, CoFeX and CoFeZrX, where X is one or more of Ta, Hf, Nb and B, on and in contact with the non-Heusler alloy layer and a second layer consisting essentially of one of Ta, Hf, Nb and B on and in contact with said first layer.

17. The head of claim 13 wherein the non-Heusler alloy layer comprises a layer of an alloy consisting essentially of Co and Fe.

18. The head of claim 13 wherein the layer of Heusler alloy is formed of a material selected from $Co_2MnX$ (where X is one or more of Ge, Si, Sn, Ga or Al) and $Co_2FeZ$ (where Z is one or more of Ge, Si, Al, Sn or Ga).

* * * * *